United States Patent
Yamanaka

(10) Patent No.: US 7,239,042 B2
(45) Date of Patent: Jul. 3, 2007

(54) CONTROL CIRCUIT CONFIGURABLE BASED ON CHARACTERISTICS OF COMMERCIAL POWER SOURCE AND IMAGE FORMING APPARATUS USING SAME

(75) Inventor: Hiromichi Yamanaka, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 296 days.

(21) Appl. No.: 10/456,624

(22) Filed: Jun. 9, 2003

(65) Prior Publication Data
US 2003/0230568 A1 Dec. 18, 2003

(30) Foreign Application Priority Data
Jun. 18, 2002 (JP) .............................. 2002-177644

(51) Int. Cl.
*H02J 3/00* (2006.01)
(52) U.S. Cl. ....................................................... 307/38
(58) Field of Classification Search .................. 307/38
See application file for complete search history.

(56) References Cited
U.S. PATENT DOCUMENTS

| | | | | |
|---|---|---|---|---|
| 4,866,955 A | * | 9/1989 | Blair et al. ................ | 68/12.23 |
| 5,612,857 A | * | 3/1997 | Ishikawa .................. | 363/21.02 |
| 6,098,175 A | * | 8/2000 | Lee ............................. | 713/320 |
| 6,404,998 B1 | * | 6/2002 | Tanaka et al. ................ | 399/66 |
| 6,624,834 B2 | * | 9/2003 | Takahashi .................... | 347/171 |
| 2001/0028809 A1 | * | 10/2001 | Maekawa ..................... | 399/85 |
| 2002/0041775 A1 | * | 4/2002 | Ishii ............................. | 399/124 |
| 2002/0077979 A1 | * | 6/2002 | Nagata ........................ | 705/40 |

* cited by examiner

*Primary Examiner*—Chau N. Nguyen
*Assistant Examiner*—Dru Parries
(74) *Attorney, Agent, or Firm*—Fitzpatrick, Cella, Harper & Scinto

(57) ABSTRACT

An electronic device includes a supply circuit board having a switching power supply circuit for outputting DC voltages in conformity with a type of commercial power, and a control circuit, which is connected to the supply circuit board, for performing control in accordance with the type of the commercial power. The control circuit discriminates the type of commercial power based upon a voltage value that is the result of dividing a DC voltage by the supply circuit board, and changes over control of a fixing heater in dependence upon the type of commercial power discriminated. When the door of an image forming apparatus is opened, the supply circuit board halts the supply of DC to a high-voltage circuit, thereby suppressing the generation of high voltage, and the control circuit is notified of the fact that the door has been opened.

24 Claims, 5 Drawing Sheets

CONTROL CIRCUIT CONFIGURABLE BASED ON CHARACTERISTICS OF COMMERCIAL POWER SOURCE AND IMAGE FORMING APPARATUS USING SAME

FIELD OF THE INVENTION

This invention relates to an electronic device that includes a control circuit for performing control that differs depending upon the power supply voltage of a commercial power supply, and to a method of controlling an image forming apparatus.

BACKGROUND OF THE INVENTION

In a conventional laser printer, power is supplied from a commercial power supply and the supplied power is applied to a power supply circuit built in the printer. From the power applied thereto, the power supply circuit generates DC voltages necessary for the laser printer, such as 3.3 V used as a low voltage for control circuits and the like, and 24 V used in motors, other drive systems and high-voltage circuits, etc. Commercial power differs in voltage and frequency depending upon the country or area.

Safety standards for the control devices of image printers such as laser printers have been defined in various countries. For example, according to the IEC-1000-3-3 standard in Europe, limit values on voltage fluctuation and flicker have been defined. Furthermore, according to the specifications of IEC-1000-3-3, the rated supply voltage and frequency of commercial power are 220 to 250 V and 50 Hz, respectively.

Ordinarily, in control of a fixing heater in a laser printer, the resistance value of a ceramic heater is optimized so as to satisfy the specifications and obtain appropriate electrophotographic fixation. In terms of controlling the temperature of the fixing heater, on/off duty and frequency are regulated to perform control so as to optimize voltage fluctuation and flicker value.

In North America, on the other hand, the rated voltage and frequency of commercial power are 120 V and 60 Hz, respectively. Consequently, it is necessary to control the resistance value and fixing temperature of the ceramic heater optimum for the commercial power supply.

In the prior art, therefore, the power supply circuit and fixing heater unit are each constructed differently depending upon the supply voltage of each country or area. In addition, the control board of the printer also performs heater control that differs depending upon the supply voltage, and therefore the control board is constructed differently according to the country or area. If printer control boards are thus prepared in accordance with the commercial power supply of each country or area, this will lead to an increase in types of printer control boards and have an adverse effect upon productivity.

SUMMARY OF THE INVENTION

Accordingly, a feature of the present invention is to provide an electronic device having a control circuit that is capable of supporting various commercial power supplies by identifying the type of commercial power supply connected, and a method of controlling an image forming apparatus.

In accordance with a preferred embodiment of the present invention, generation of high voltage is halted when the door of an electronic device or image forming apparatus is opened, and the fact that the door has been opened can be reported to a control circuit.

According to the present application, there is providing an electronic device comprising:

a first circuit board having a power supply circuit for outputting DC voltages in conformity with a type of commercial power; and a second circuit board connected to the first circuit board and having a control circuit for performing control in accordance with the type of the commercial power;

wherein the first circuit board has generating means for generating an analog voltage, which corresponds to the type of the commercial power, based upon a prescribed DC voltage, and the control circuit changes over control in accordance with the analog voltage.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail with reference to the accompanying drawings.

First Embodiment

Figure 1:
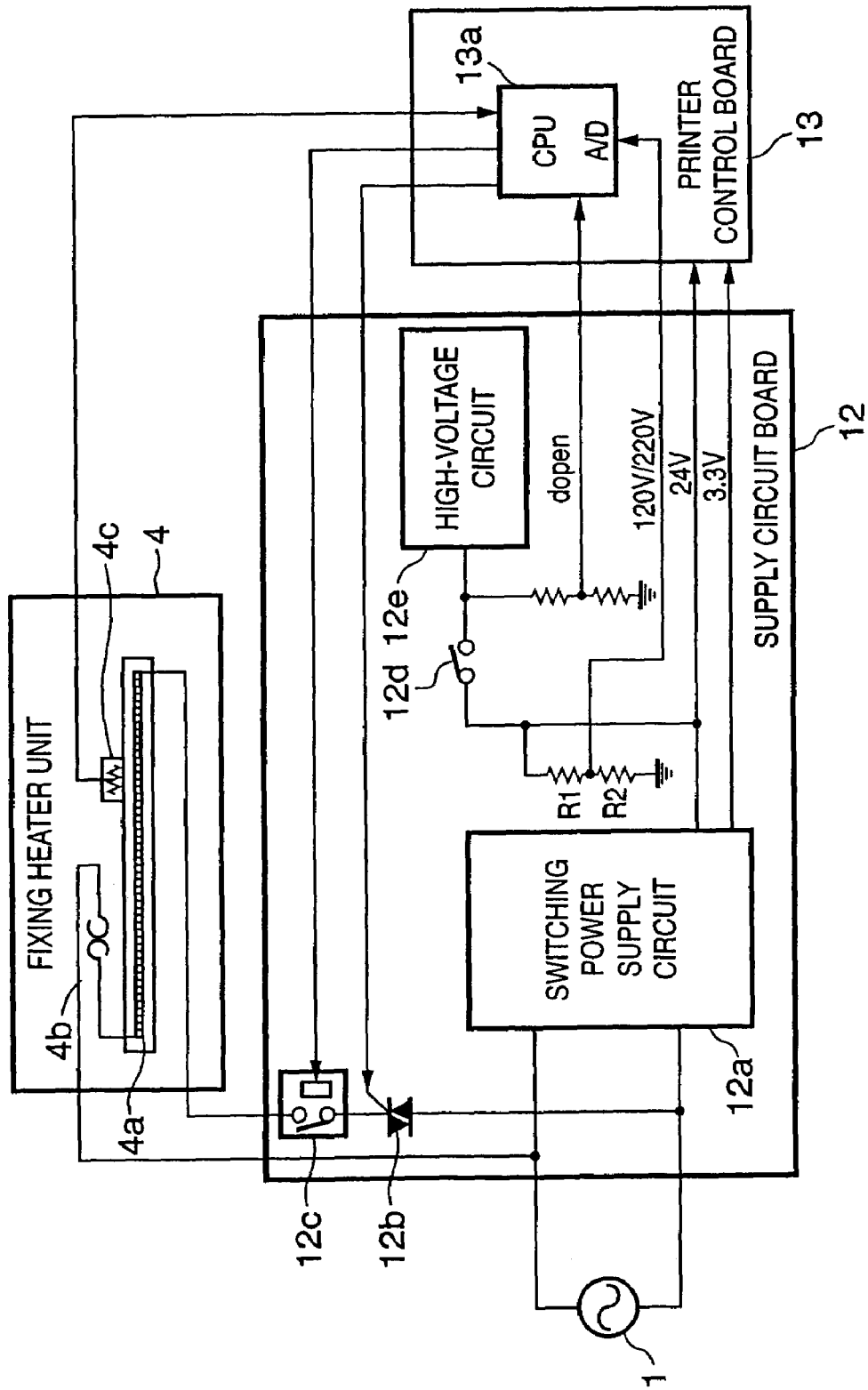
FIG. 1 is a block diagram illustrating the general structure of a laser printer according to a first embodiment of the present invention.

FIG. 1 depicts a block diagram illustrating the general structure of a laser printer according to a first embodiment of the present invention.

As shown in FIG. 1, a commercial power supply 1 has a power-supply voltage and frequency that differ depending upon the country or area. A supply circuit board 12 generates DC voltages necessary for the laser printer by means of a switching power supply circuit 12a based upon supply voltage supplied from the commercial power supply 1. Examples of the DC voltage are 3.3 V used for control circuits and small signals, and 24 V used in motors, other drive mechanisms and in a high-voltage circuit 12e, etc. The supply circuit board 12 further includes a circuit for controlling passage of current to a fixing heater 4a. Current is fed to or cut off from the fixing heater 4a by turning a triac 12b on and off, thereby making it possible to regulate the temperature of the ceramic heater 4a to a prescribed temperature. A relay 12c cuts off the supply of power to the ceramic heater 4a during printer standby or when a malfunction occurs in control of fixing temperature. A printer control board 13 has a CPU 13a such as a microprocessor for controlling an electrophotographic process necessary to achieve printing by the laser printer. The CPU 13a further controls the on/off operation of the triac 12b and the operation of the relay 12c. A fixing heater unit 4 has the ceramic heater 4a and a temperature fuse 4b, which is a safety circuit. The temperature fuse 4b opens the circuit by melting when the ceramic heater 4a attains an abnormally high temperature. A thermistor 4c detects the temperature of the ceramic heater 4a. Temperature information detected by the thermistor 4c is input to the CPU 13a, which proceeds to control the ceramic heater 4a to the prescribed temperature in accordance with this temperature information.

The 24 V from the switching power supply circuit 12a is input to the high-voltage circuit 12e, which generates the high voltage used in a well-known electrophotographic process. An interlock switch 12d cuts off the input voltage (24 V) to the high-voltage circuit 12e when a door on the body of the laser printer is opened by the user in order to unjam paper, for example, thereby interrupting the output from the high-voltage circuit 12e. Further, the voltage (24 V) on the output side of the interlock switch 12d is divided and input to the input port of the CPU 13a as a door-open signal "dopen". As a result, if the dopen signal becomes approximately 0 V, the CPU 13a is capable of recognizing the fact that the door of the laser printer has been opened.

Furthermore, the DC supply voltage (24 V in this embodiment) output from the switching power supply circuit 12a is divided by resistors R1 and R2, and the analog voltage resulting from this voltage division is input to an A/D input port of the CPU 13a. The resistance values of the resistors R1 and R2 are each set to different values depending upon whether the supply circuit board 12 is a 120-V board or a 220-V board. Accordingly, by inputting the voltage value obtained by voltage division by the resistors R1 and R2 to the CPU 13a, the CPU 13a can discriminate whether the supply circuit board 12 mounted within the laser printer is a 120-V board or a 220-V board. In other words, the CPU 13a can discriminate the type of commercial power supply 1 to which the laser printer has been connected. Optimum control of the temperature of the ceramic heater 4a for the purpose of satisfying the above-mentioned standards can be achieved in dependence upon the type of commercial power supply 1 discriminated. As a result, the printer control board 13 can be used as a common board suited to all commercial power supplies. This makes it unnecessary to change the board in accordance with each type of commercial power supply and leads to commonality of units.

In this embodiment, the A/D input port of the CPU 13a is used in discriminating the voltage value obtained by voltage division. This means that the commercial power supply is not limited to two types, i.e., 120V and 220V. For example, the commercial power supply may be 100 V/50 Hz or 100 V/60 Hz, as in Japan, or 200 V/50 Hz, as in Hong Kong. By changing the resistance ratio between the resistors R1 and R2 accordingly, the CPU 13a can discriminate the type of commercial power supply that corresponds to the supply circuit board 12. As a result, temperature control of the fixing heater that conforms to each commercial power supply can be carried out and voltage fluctuation and flicker value can be minimized.

Figure 2:
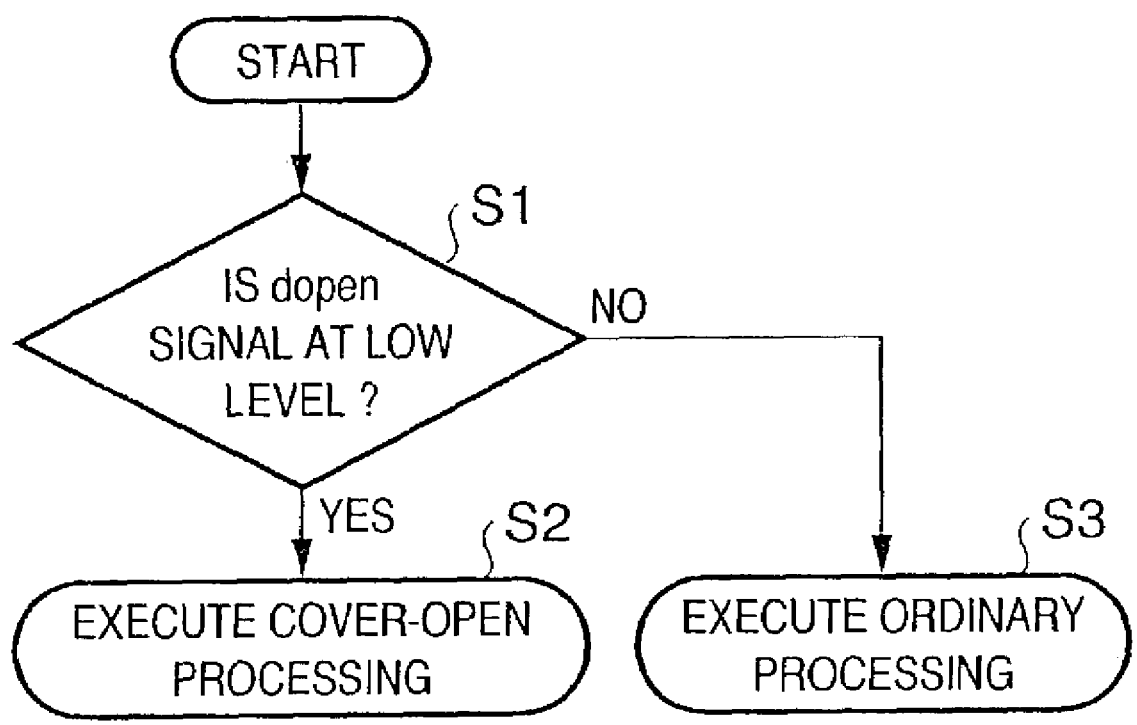
FIG. 2 is a flowchart illustrating door open/close detection processing in the printer according to the first embodiment.

FIG. 2 is a flowchart of processing executed by the CPU 13a of the laser printer according to this embodiment in a case where the printer door (cover) has been opened.

First, at step S1 in FIG. 2, the CPU 13a determines whether the dopen signal being applied to its input port is at the low level (about 0 V). As described above, this laser printer is such that when the door of the printer is opened, the supply of 24-V power from the switching power supply circuit 12a is cut off by the interlock switch 12d, as a result of which the signal level of the dopen signal becomes approximately 0 V ("YES" at step S1). In this case, control proceeds to step S2, at which processing is executed to display a "DOOR OPEN" message on a control panel and halt the printing operation. If the dopen signal is at the high level ("NO" at step S1), on the other hand, this means that the door is closed and, hence, the voltage of 24 V is being output normally. Control therefore proceeds to step S3, at which the usual processing is executed.

Figure 3:
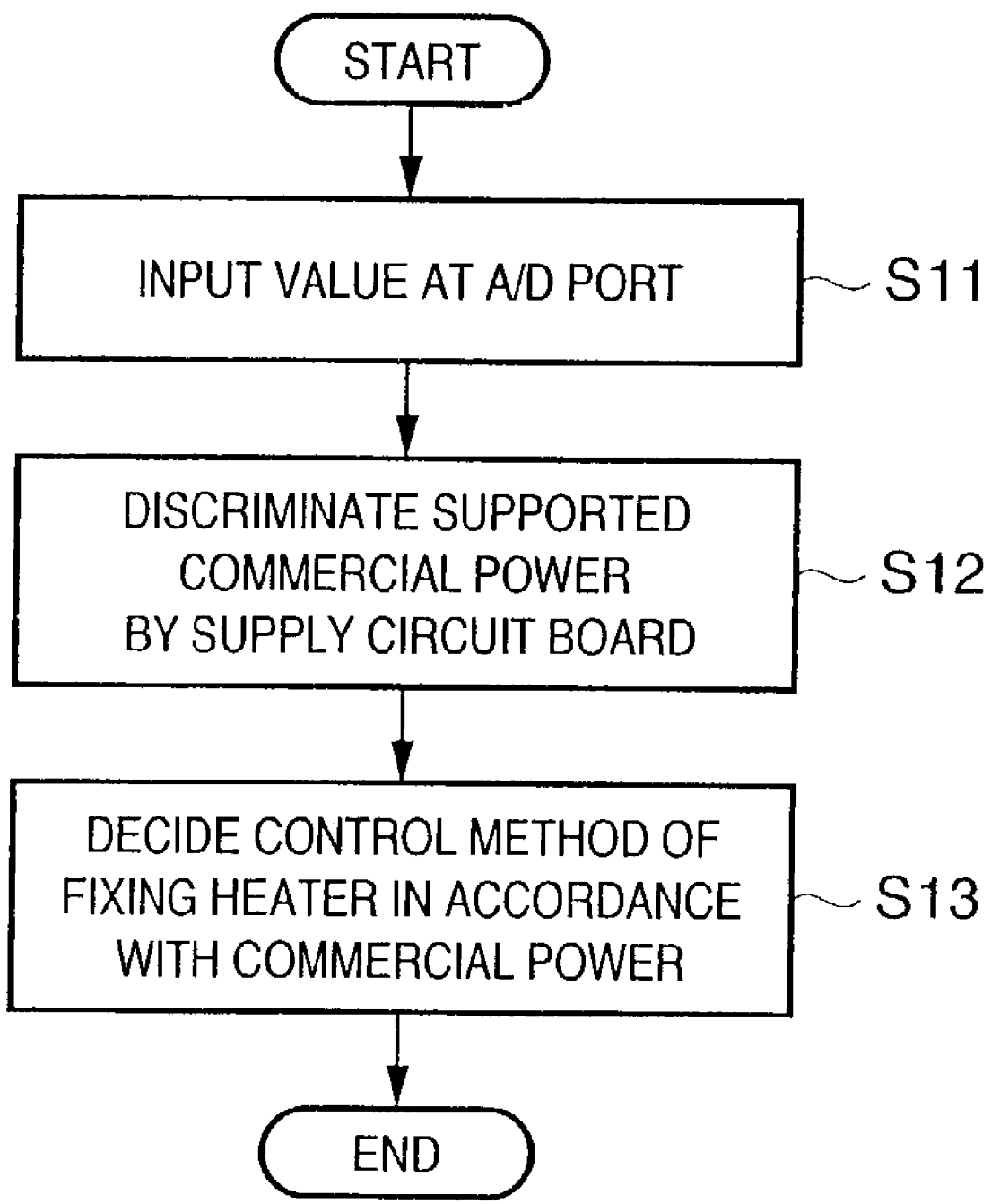
FIG. 3 is a flowchart illustrating processing for discriminating the type of commercial power supply circuit in the printer according to the first embodiment.

FIG. 3 is a flowchart illustrating processing executed by the CPU 13a of the laser printer according to this embodiment for discriminating the commercial power supply circuit supported by the supply circuit board 12.

First, at step S11 in FIG. 3, a digital value resulting from analog-to-digital conversion of the voltage value (obtained by voltage division) entering the A/D input port of the CPU 13a is input. Control then proceeds to step S12, at which the CPU 13a discriminates, based upon the digital value, the commercial power supply supported by the supply circuit board 12. For example, the CPU 13a determines that:

(1) the commercial power supply is Japan-specific (100 V, 50 Hz) when the voltage value obtained by voltage division is 3 V (resistance ratio 7:1);

(2) the commercial power supply is Japan-specific (100 V, 60 Hz) when the voltage value obtained by voltage division is about 2.67 V (resistance ratio 8:1);

(3) the commercial power supply is Europe-specific when the voltage value obtained by voltage division is 2.4 V (resistance ratio 9:1); and (4) the commercial power supply is USA-specific when the voltage value obtained by voltage division is about 2.1 V (resistance ratio 10:1).

It should be noted that the CPU 13a discriminates the corresponding types of commercial power supply based upon respective ones of the digital values corresponding to the above-cited voltage values.

When the type of commercial power supply is thus determined, control proceeds to step S13, at which the method of controlling the fixing heater 4a, for example, is decided in accordance with the type of commercial power supply determined.

Second Embodiment

Figure 4:
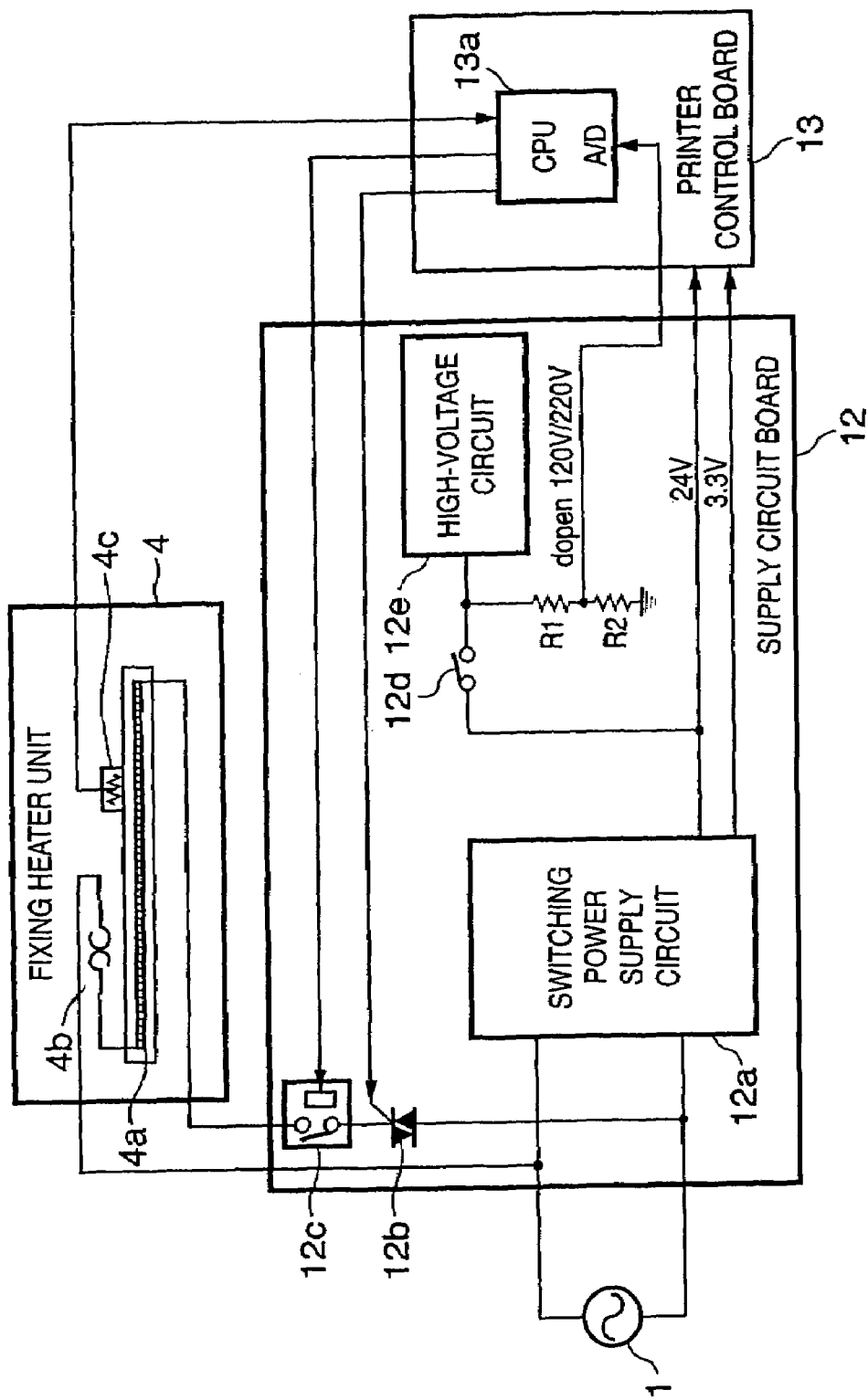
FIG. 4 is a block diagram illustrating the general structure of a laser printer according to a second embodiment of the present invention.

FIG. 4 is a block diagram illustrating the general structure of a laser printer according to a second embodiment of the present invention. Components identical with those of FIG. 1 are designated by like reference characters and need not be described again.

In the first embodiment above, the dopen signal indicating the door of the printer has been opened and the voltage value that is the result of dividing the supply voltage of 24 V by the resistances R1 and R2 are input separately to the CPU 13a. In the second embodiment, however, effects similar to those of the first embodiment are obtained by adopting a single common signal for both a voltage value, which is the result of dividing, by the resistances R1 and R2, the 24 V for the high voltage interrupted by the interlock switch 12d, and the above-mentioned dopen signal.

More specifically, 0 V is input to the A/D input port of the CPU 13a when the door is open, and the analog voltage that results from voltage division by the resistances R1, R2 is input to the A/D input port when the door is closed. Naturally, when the door is open, the temperature of the fixing heater 4a is not controlled and therefore it is possible to discriminate, by this single signal, when the door is open, when the door is closed and the type of commercial power supply voltage. In addition, since the same signal is used in detection of whether the door is open or closed and in discrimination of the type of commercial power supply voltage, the number of signal lines can be reduced and the cost of the apparatus can be reduced.

Figure 5:
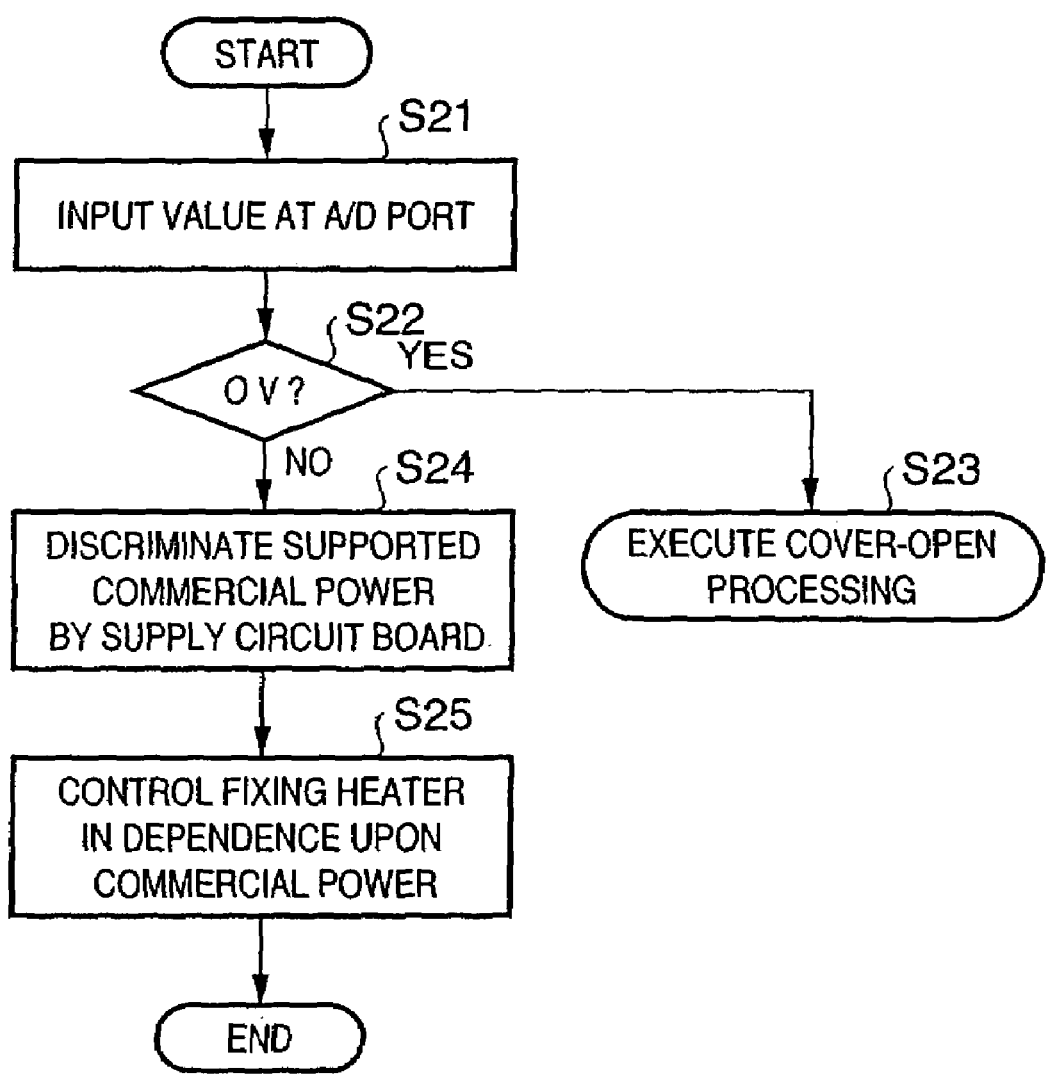
FIG. 5 is a flowchart illustrating processing for determining whether a door has been opened and for discriminating the type of commercial power supply circuit in the printer according to the second embodiment.

The processing executed in this case is as illustrated in the flowchart of FIG. 5.

First, at step S21 in FIG. 5, a digital value resulting from analog-to-digital conversion of the voltage value (obtained by voltage division) entering the A/D input port of the CPU 13a is input. Control then proceeds to step S22, at which the CPU 13a determines whether the digital value is 0 or substantially 0, namely whether the door is open. If the door is open ("YES" at-step S22), control proceeds to step S23, where processing similar to that of step S2 above is executed in response opening of the printer door (cover).

On the other hand, if the digital value is not 0 or substantially 0 ("NO" at step S22), control proceeds to step S24. Here the CPU 13a discriminates, in a manner similar to that of step S12 in FIG. 3 based upon the digital value entered at step S21, the commercial power supply supported by the supply circuit board 12. When the type of commercial power supply is thus determined, control proceeds to step S25, at which the method of controlling the fixing heater 4a, for example, is decided in a manner similar to that of step S13 in FIG. 3 in accordance with the type of commercial power supply determined.

The present invention can be applied to a system constituted by a plurality of devices (e.g., a host computer, interface, reader, printer, etc.) or to an apparatus comprising a single device (e.g., a copier or facsimile machine, etc.).

Further, it almost goes without saying that the object of the invention is attained also by supplying a storage medium (or recording medium) on which the program codes of the software for performing the functions of the foregoing embodiments to a system or an apparatus have been recorded, reading the program codes with a computer (e.g., a CPU or MPU) of the system or apparatus from the storage medium, and then executing the program codes. In this case, the program codes read from the storage medium themselves implement the novel functions of the embodiments, and the program codes per se and storage medium storing the program codes constitute the invention. Further, besides the case where the aforesaid functions according to the embodiments are implemented by executing the program codes read by a computer, it almost goes without saying that the present invention covers a case where an operating system or the like running on the computer performs a part of or the entire process based upon the designation of program codes and implements the functions according to the embodiments.

The present invention further covers a case where, after the program codes read from the storage medium are written in a function expansion card inserted into a computer or in a memory provided in a function expansion unit connected to the computer, a CPU or the like contained in the function expansion card or function expansion unit performs a part of or the entire process based upon the designation of program codes and implements the function of the above embodiments.

Though the above embodiments have been described independently, specific features and functionality thereof may be combined.

Thus, in accordance with the embodiments as described above, a power supply circuit board outputs an analog voltage signal that conforms to the type of each commercial power supply, and this signal is input to an analog input port of a CPU on a control board, whereby the CPU is capable of recognizing the type of commercial power supply to which a printer has been connected. As a result, arrangements corresponding to commercial power supplies of a plurality of types can be constructed by a printer control board of a single type.

Further, by using this analog voltage signal conjointly as a signal for sensing whether a door is open or closed, the number of signal lines can be reduced, thereby making it possible to reduce the cost of the apparatus.

The present invention is not limited to the above embodiments and various changes and modifications can be made within the spirit and scope of the present invention. Therefore, to apprise the public of the scope of the present invention, the following claims are made.

What is claimed is:

1. An electronic device comprising:
a circuit board having a power supply circuit for generating a DC voltage using a commercial AC power source, and a switching element for switching AC power from the commercial AC power source to a load connected to said circuit board, wherein said circuit board is configured to output an analog signal using the DC voltage generated by the power supply circuit, and wherein a level of the analog signal corresponds to a type of the commercial AC power source; and
a control circuit connected to said circuit board and configured to control the switching element depending on the type of the commercial AC power source in accordance with the analog signal from said circuit board, so as to control switching of the AC power from the commercial AC power source to the load in accordance with the type of the commercial AC power source,
wherein the analog signal is obtained by dividing the DC voltage generated by the power supply circuit by a ratio corresponding to the type of the commercial AC power source.

2. The device according to claim 1, wherein said electronic device is an image forming apparatus.

3. The device according to claim 2, wherein the load is a fixing heater of the image forming apparatus.

4. The device according to claim 2, wherein the DC voltage generated by the power supply circuit is output or cut off in accordance with whether a door of the image forming apparatus is open or closed.

5. The device according to claim 1, wherein said circuit board further comprises a high-voltage circuit adapted to generate a voltage higher than the DC voltage based upon the DC voltage from said power supply circuit.

6. The device according to claim 1 , wherein said power supply circuit comprises a circuit configured to generate a second DC voltage and to supply the second DC voltage to said control circuit.

7. The device according to claim 1, wherein said circuit board comprises a circuit constructed to generate a signal representing whether a cover of the electronic device is opened or not and to output the signal to said control circuit.

8. A control circuit in an electronic device, wherein the electronic device comprises a circuit board having a power supply circuit for generating a DC voltage using a commercial AC power source, a switching element for switching AC power from the commercial power source to a load connected to the circuit board, and a circuit for generating an analog signal using the DC voltage generated by said power supply circuit, wherein a level of the analog signal corresponds to a type of the commercial AC power source, said control circuit comprising:

an input circuit configured to input the analog signal from the circuit board; and an output circuit configured to output a control signal for controlling the switching element based upon the analog signal, so as to control switching of the AC power from the commercial AC power source to the load in accordance with the type of the commercial AC power sources, wherein the analog signal is obtained by dividing the DC voltage from the power supply circuit by a ratio corresponding to the type of commercial AC power source.

9. The circuit according to claim 8, wherein the control circuit is used in an image forming apparatus.

10. The circuit according to claim 8, further comprising an A/D converter configured to convert the analog signal to a digital signal.

11. The circuit according to claim 8, wherein the analog signal has a signal level corresponding to the type of the commercial AC power source and a state of a door of the electronic device.

12. The circuit according to claim 8, wherein the analog signal has a signal level corresponding to the type of the commercial AC power source in a case where a door of the electronic device is closed, and the analog signal has a signal level not corresponding to the type of the commercial AC power source in a case where the door of the electronic device is opened.

13. The circuit according to claim 8, wherein the load is a fixing heater of the image forming apparatus.

14. The circuit according to claim 8, wherein said control circuit receives a second DC voltage generated by said power supply circuit of said circuit board.

15. The circuit according to claim 8, wherein said control circuit receives a signal output from said circuit board, wherein the signal indicates whether a cover of the electronic device is opened or not.

16. A circuit board for supplying DC power to an electronic device based on a commercial AC power source, wherein said circuit board is configurable in correspondence to a type of the commercial AC power source, and wherein said electronic device comprises a control circuit which is independent of the type of the commercial AC power source, said circuit board comprising:

a power supply circuit configured to generate a DC voltage using the commercial AC power source;

a switching element configured to switch AC power from the commercial AC power source to a load connected to said circuit board; and a circuit configured to generate an analog signal using the DC voltage generated by said power supply circuit, wherein a level of the analog signal corresponds to the type of the commercial AC power source, and to output the analog signal to the control circuit, so that the control circuit can control switching of the AC power by said switching element in accordance with the analog signal generated by said circuit, whereby a power supplied to the load is controlled in accordance with the type of the commercial AC power source, wherein the analog signal is obtained by configuring the circuit board to divide the DC voltage generated by said power supply circuit by a ratio corresponding to the type of the commercial AC power source.

17. The circuit board according to claim 16, wherein the electronic device is an image forming apparatus.

18. The circuit board according to claim 17, wherein the load is a fixing heater of the image forming apparatus.

19. The circuit board according to claim 17, wherein the DC voltage generated by the power supply circuit is output or cut off in accordance with whether a door of the image forming apparatus is open or closed.

20. The circuit board according to claim 16, further comprising a high-voltage circuit configured to generate a voltage higher than the DC voltage based upon the DC voltage generated by said power supply circuit.

21. The circuit board according to claim 16, wherein said power supply circuit comprises a circuit for generating a second DC voltage and for supplying the second DC voltage to said control circuit.

22. The circuit board according to claim 16, further comprising a circuit configured to generate a signal indicating whether a cover of the electronic device is opened or not, and to output the signal to said control circuit.

23. The circuit according to claim 16, wherein the analog signal has a signal level corresponding to the type of the commercial AC power source and a state of a door of the electronic device.

24. The device according to claim 16, wherein the analog signal has a signal level corresponding to the type of the commercial AC power source in a case where a door of the electronic device is closed, and the analog signal has a signal level not corresponding to the type of the commercial AC power source in a case where the door of the electronic device is opened.

* * * * *

UNITED STATES PATENT AND TRADEMARK OFFICE
CERTIFICATE OF CORRECTION

PATENT NO. : 7,239,042 B2  Page 1 of 1
APPLICATION NO. : 10/456624
DATED : July 3, 2007
INVENTOR(S) : Hiromichi Yamanaka It is certified that error appears in the above-identified patent and that said Letters Patent is hereby corrected as shown below:

COLUMN 2
      Line 1, "providing" should read --provided--.

COLUMN 4
      Line 15, "which" should read --which time--; and
      Line 44, "which" should read --which time--.

COLUMN 5
      Line 21, "at-step" should read --at step--; and
      Line 23, "response opening" should read --response to opening--.

COLUMN 7
      Line 18, "sources," should read --source,--.

Signed and Sealed this

Eighteenth Day of March, 2008

JON W. DUDAS
*Director of the United States Patent and Trademark Office*